(12) United States Patent
Koike et al.

(10) Patent No.: US 9,827,868 B2
(45) Date of Patent: Nov. 28, 2017

(54) SECONDARY BATTERY CONTROL UNIT

(71) Applicant: DENSO CORPORATION, Kariya, Aichi-pref. (JP)

(72) Inventors: Yuuji Koike, Kariya (JP); Keiichi Kato, Kariya (JP); Toshiyuki Kawai, Kariya (JP)

(73) Assignee: DENSO CORPORATION, Kariya (JP)

( * ) Notice: Subject to any disclaimer, the term of this patent is extended or adjusted under 35 U.S.C. 154(b) by 134 days.

(21) Appl. No.: 15/058,446

(22) Filed: Mar. 2, 2016

(65) Prior Publication Data
US 2016/0264016 A1 Sep. 15, 2016

(30) Foreign Application Priority Data

Mar. 9, 2015 (JP) .................................. 2015-45904

(51) Int. Cl.
| | |
|---|---|
| *H02J 7/00* | (2006.01) |
| *B60L 11/18* | (2006.01) |
| *H02J 7/14* | (2006.01) |
| *G01R 31/36* | (2006.01) |

(52) U.S. Cl.
CPC ........... *B60L 11/1861* (2013.01); *H02J 7/007* (2013.01); *H02J 7/0021* (2013.01); *H02J 7/1461* (2013.01); *G01R 31/3624* (2013.01); *G01R 31/3651* (2013.01); *G01R 31/3662* (2013.01); *Y02T 10/7005* (2013.01); *Y02T 10/7055* (2013.01)

(58) Field of Classification Search
USPC ........................................ 320/134, 136, 162
See application file for complete search history.

(56) References Cited

U.S. PATENT DOCUMENTS

| | | | | |
|---|---|---|---|---|
| 2013/0154577 A1* | 6/2013 | Iwane | ................ | G01R 31/3624 320/162 |
| 2013/0185008 A1* | 7/2013 | Itabashi | ............. | G01R 31/3651 702/63 |
| 2014/0340045 A1* | 11/2014 | Itabashi | ............. | G01R 31/3624 320/134 |
| 2015/0260800 A1* | 9/2015 | Baba | .................. | G01R 31/3651 702/63 |

(Continued)

FOREIGN PATENT DOCUMENTS

JP        2012-159414        8/2012

OTHER PUBLICATIONS

U.S. Appl. No. 14/879,761, Kawai et al.

*Primary Examiner* — Brian Ngo
(74) *Attorney, Agent, or Firm* — Posz Law Group, PLC

(57) ABSTRACT

A secondary battery control unit has a calculating portion identifying a parameter of an equivalent circuit based on an estimation error that is obtained by a comparison between an actual output value of a secondary battery and an equivalent output value of the equivalent circuit. Based on a predetermined amount of an infinitesimal change in the parameter and an evaluation function that is obtained using a result of the comparison, the calculating portion numerically calculates a slope of the evaluation function and renews the parameter based on the slope. As a result, the secondary battery control unit has the calculating portion capable of identifying the parameter of the equivalent circuit while reflecting effects of deterioration of the secondary battery and capable of being integrated to a vehicle-mounted microcomputer.

4 Claims, 6 Drawing Sheets

(56) References Cited

U.S. PATENT DOCUMENTS

2016/0103184 A1* 4/2016 Kawai ................ G01R 31/3651
                                                  702/63
2016/0252585 A1* 9/2016 Baba .................... H01M 10/48
                                                  702/63

* cited by examiner

SECONDARY BATTERY CONTROL UNIT

CROSS REFERENCE TO RELATED APPLICATION

This application is based on Japanese Patent Application No. 2015-45904 filed on Mar. 9, 2015, the disclosure of which is incorporated herein by reference.

TECHNICAL FIELD

The present disclosure relates to a secondary battery control unit controlling a secondary battery that is equipped to a vehicle driven by at least a motor.

BACKGROUND

As a device that estimates a state of a secondary battery and controls the secondary battery, for example, a control unit described in JP 2012-159414 A has been known. The control unit described in JP 2012-159414 A estimates the state of the secondary battery including a nonlinear area of a current-voltage characteristic, based on a battery model (hereinafter, referred to as a 1 RC equivalent circuit model) that includes one direct current (DC) resistance and one RC equivalent circuit.

According to JP 2012-159414 A, the 1 RC equivalent circuit model cannot express the characteristic in the nonlinear area. Therefore, the 1 RC equivalent circuit model sets a filter to attenuate a signal in the nonlinear area and make a calculation only with data in a linear area. As such, the 1 RC equivalent circuit model can manage the characteristic in the nonlinear area. It has been known that the nonlinear current-voltage characteristic of the secondary battery is more dominant with a temperature of the secondary battery reduces. Especially, in a temperature range of 0° C. or less, the nonlinear current-voltage characteristic is not negligible. Therefore, according to JP 2012-159414 A, since the data that can be used in the calculation is decreased in the temperature range of 0° C. or less, there is a possibility that the control unit cannot make an accurate calculation and an estimating accuracy of the state of the secondary battery is decreased. To address this possibility, it can be considered a control unit capable of estimating the state of the secondary battery accurately even when the secondary battery has a low temperature.

SUMMARY

To estimate the state of the secondary battery accurately even when the secondary battery has a low temperature as describe above, it can be considered that parameters of a resistance and a capacitance of a diffusion resistance are calculated while being associated with a temperature, which is measured beforehand. However, in a calculating method using such fixed values, changes of the parameters caused by, for example, deterioration of the secondary battery cannot be reflected.

To reflect effects of the deterioration of the secondary battery, the parameters need to be identified in real-time. For example, in an adaptive filter, the parameters can be identified in real-time by calculating a slope of the sum of squared errors, which is an evaluation function, and searching a point at which the slope has a minimum value. In this method, however, a calculation of a partial derivative is needed to obtain the slope of the evaluation function. Therefore, the calculation of the partial derivative will be complicated especially with the number of samplings increases.

It is an object of the present disclosure to provide a secondary battery control unit having a calculating portion capable of identifying a parameter of an equivalent circuit while reflecting effects of deterioration of a secondary battery and capable of being integrated to a vehicle-mounted microcomputer in views of a calculation amount.

According to an aspect of the present disclosure, a secondary battery control unit controls a secondary battery that is equipped to a vehicle driven by at least a motor, and includes an equivalent circuit and a calculating portion. The equivalent circuit expresses the secondary battery. The calculating portion identifies a parameter of the equivalent circuit based on an estimation error obtained by a comparison between an actual output value of the secondary battery and an equivalent output value of the equivalent circuit. Based on a predetermined amount of an infinitesimal change in the parameter and an evaluation function that is obtained using a result of the comparison, the calculating portion numerically calculates a slope of the evaluation function and renews the parameter based on the slope.

Accordingly, the calculating portion can renew the parameter by numerically calculating the slope of the evaluation function, without calculating a partial derivative. As a result, a calculation amount of the calculating portion can be decreased and the calculating portion can be integrated in a vehicle-mounted microcomputer.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Embodiment of the present disclosure will be described hereinafter with reference to the drawings. To make the description easier to understand, same elements of the drawings will be designated with the same symbols as far as possible and descriptions thereof will not be repeated.

Figure 1:
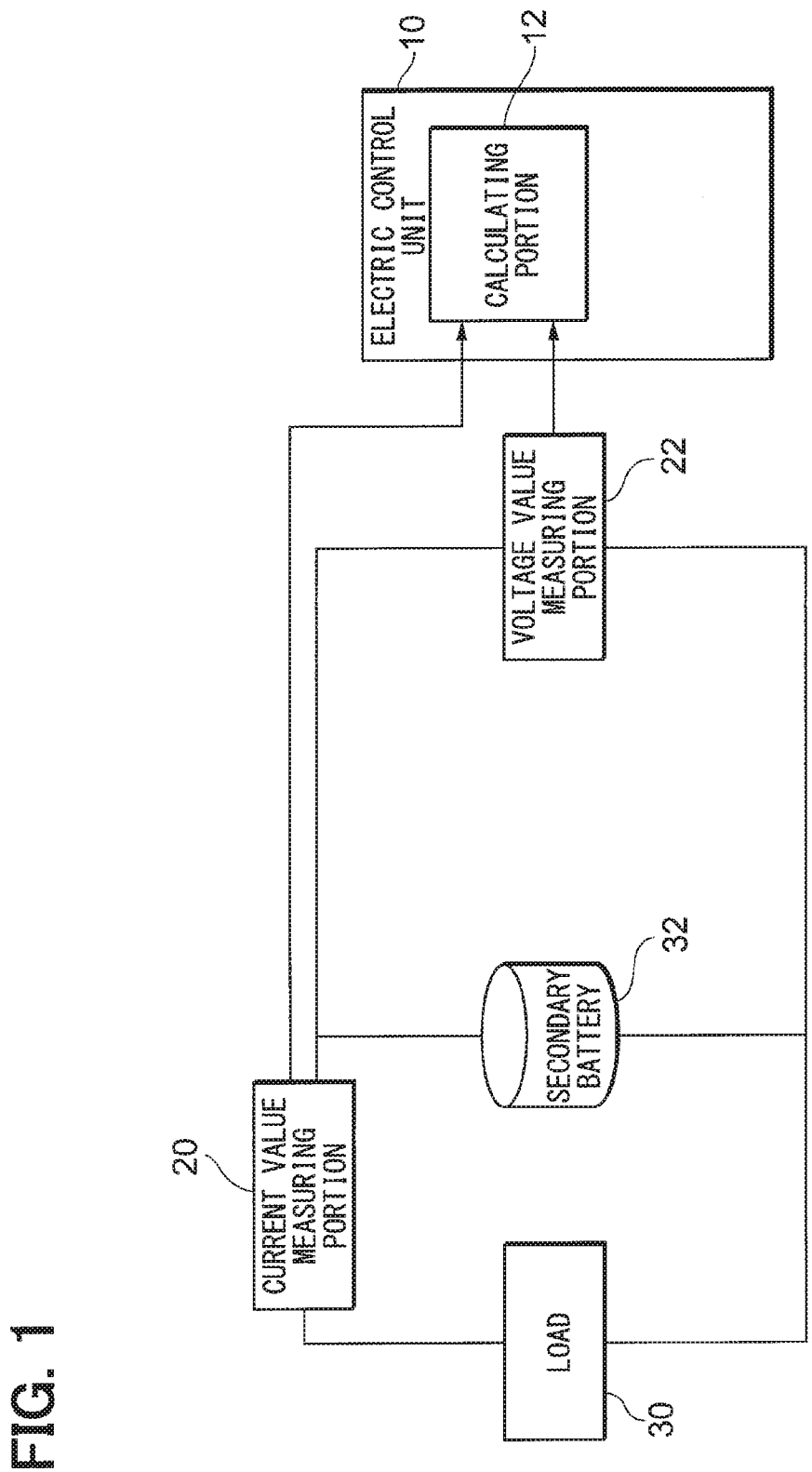
FIG. 1 is a configuration diagram of a system to which an electronic control unit according to an embodiment of the present disclosure is employed.

As shown in FIG. 1, a system to which an electronic control unit 10 (secondary battery control unit) is employed includes a current value measuring portion 20, a voltage value measuring portion 22, a load 30 and a secondary battery 32 in addition to the electronic control unit 10.

The secondary battery 2 of the electronic control unit 10 is a secondary battery such as a lithium ion battery whose state of charge (SOC) is to be monitored. The current value measuring portion 20 measures a current value of the secondary battery 32 and outputs the current value to the electronic control unit 10. The voltage value measuring portion 22 measures a voltage value (actual output value) of the secondary battery 32 and outputs the voltage value to the electronic control unit 10. The load 30 of the electronic control unit 10 is a load such as a main motor that is connected to the secondary battery 32.

The electronic control unit 10 has a calculating portion 12. The calculating portion 12 identifies parameters of an equivalent circuit of the secondary battery 32 based on the current value outputted from the current value measuring portion 20 and the voltage value outputted from the voltage value measuring portion 22, and estimates the SOC. The calculating portion 12 is integrated as a microcontroller to the electronic control unit 10.

Figure 2:
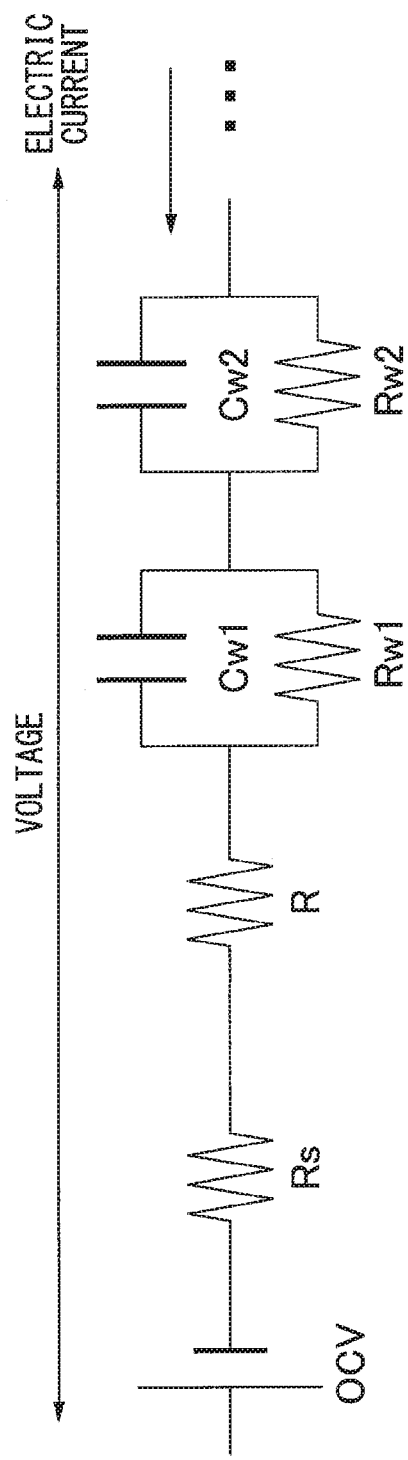
FIG. 2 is a diagram illustrating an example of an equivalent circuit model of a secondary battery.

Next, a processing of the calculating portion 12 will be described with reference to FIG. 2 and FIG. 3. As shown in FIG. 2, an equivalent circuit model includes a DC resistance Rs, a reaction resistance R and a diffusion resistance. The reaction resistance R has a nonlinear characteristic that is derived from Butler-Volmer equation. The diffusion resistance includes a parallel circuit of a resistance Rw1 and a capacitance Cw1 and a parallel circuit of a resistance Rw2 and a capacitance Cw2, and these parallel circuits are connected in series.

Figure 3:
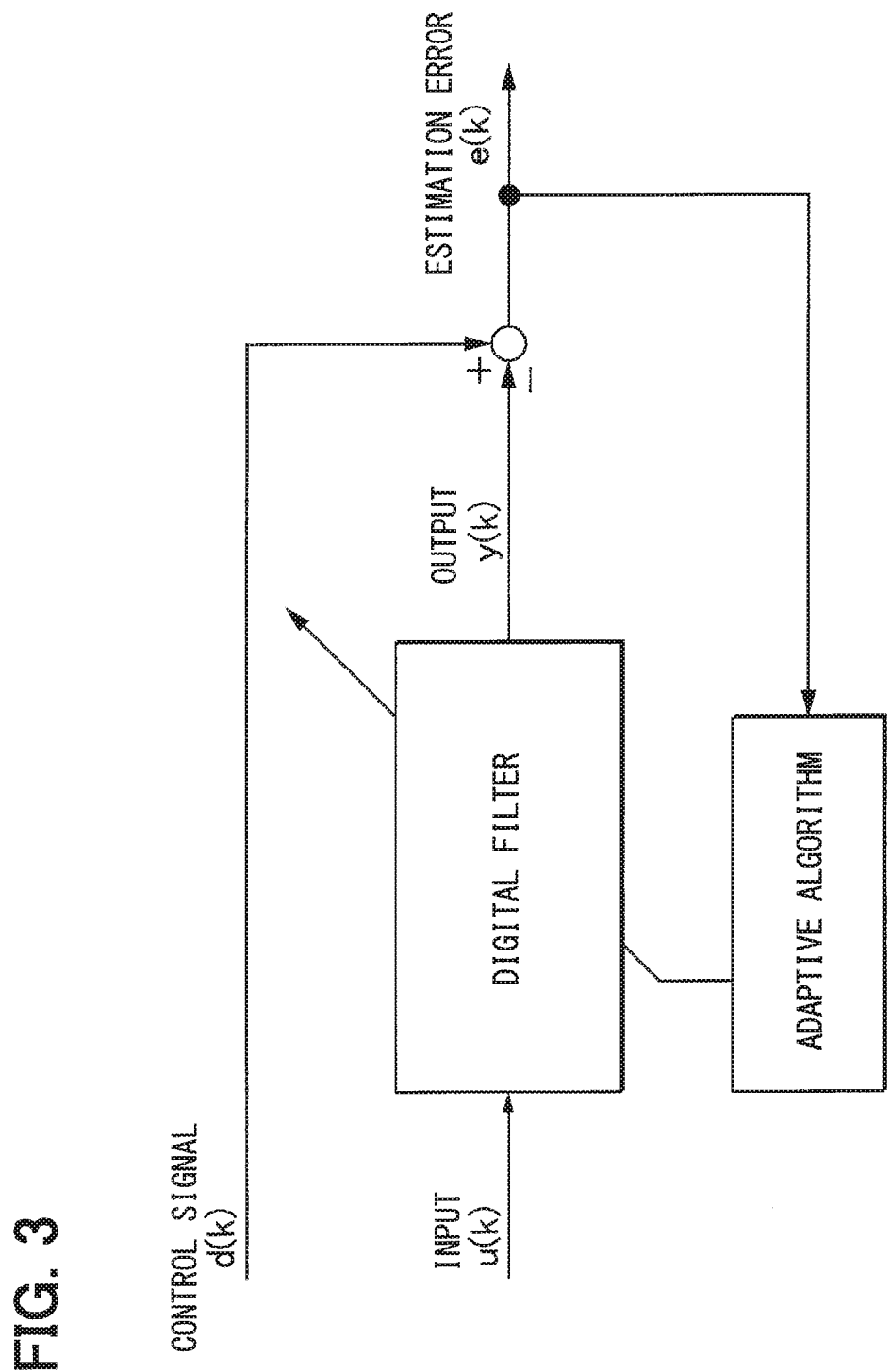
FIG. 3 is a diagram illustrating a basic form of an adaptive filter.

Generally, a basic form of the adaptive filter shown in FIG. 3 is expressed by a formula (f1)) and a formula (f2).

[Eq. 1]

$$W(k+1) = W(k) - \mu \cdot \nabla(k) \tag{f1}$$

$$\nabla(k) = \frac{\partial J}{\partial W(k)} \tag{f2}$$

Terms in the formula (f1) and the formula (f2) are as follows. In the present embodiment, bold letters in the formulas represent vector quantity and normal letters in the formulas represent scalar quantity. That is, in the formula (f1) and the formula (f2). W and ∇ are vector quantity, and k, μ and J are scalar quantity. W(k) represents a parameter vector of the filter. k represents the number of samplings. μ represents a step size. J represents an evaluation function.

In such a case, W is a parameter of the diffusion resistance of the equivalent circuit model (see FIG. 2) and is expressed as follows.

$$W=[Rw1 \; Rw2 \ldots Rwn \; Cw1 \; Cw2 \ldots Cwn]$$

n represents a degree of a RC parallel circuit.

Hereinafter, to simplify the description, cases where n=1 will be described. Also, in the following description, a portion corresponding to W in FIG. 2 will be only considered. The DC resistance Rs and the reaction resistance R, which is derived from Butler-Valmer equation and has the nonlinear characteristic, can be calculated by another method. By considering the DC resistance Rs, the reaction resistance R and an open circuit voltage (OCV) together, a voltage applied to the diffusion resistance can be calculated from the voltage value (actual output value) of the secondary battery 32 measured by the voltage value measuring portion 22.

An error e and the evaluation function J are defined as a formula (f3) and a formula (f4). When the formula (f3) is substituted in the formula (f4), and the resulting formula (f4) is further substituted in the formula (f2), a formula (f5) can be obtained. d(k) is the voltage value of the secondary battery 32 measured by the voltage value measuring portion 22. y(k) is an output value of a digital filter (the voltage value of the equivalent circuit model) that corresponds to the current value of the secondary battery 2 measured by the current value measuring portion 20.

[Eq. 2]

$$e(k) = d(k) - y(k) \tag{f3}$$

$$J(k) = E[e^2(k)] \tag{f4}$$

$$\nabla(k) = \frac{\partial J}{\partial W(k)} = \frac{\partial \frac{\sum \{d(k) - y(k)\}^2}{N}}{\partial W(k)} \tag{f5}$$

Hereinafter, y (=V: voltage) in the case of n=1 will be calculated specifically. An impedance of the RC parallel circuit can be calculated as expressed by a formula (f6).

[Eq. 3]

$$Z(s) = \frac{R}{RCs + 1} \tag{f6}$$

When a formula (f7) is discretized using Backward-Euler method, a formula (f8) can be obtained.

[Eq. 4]

$$s = \frac{1 - z^{-1}}{T} \tag{f7}$$

[Eq. 5]

$$V(k) = \frac{RC}{T + RC} V(k-1) + \frac{RT}{T + RC} I(k) \tag{f8}$$

When V(k+1) is calculated from the formula (f8), a formula (f9) can be obtained.

[Eq. 6]

$$\begin{aligned} V(k+1) &= \frac{RC}{T+RC}\underline{V(k)} + \frac{RT}{T+RC}I(k+1) \\ &= \frac{RC}{T+RC}\left\{\frac{RC}{T+RC}\underline{V(k-1)} + \frac{RT}{T+RC}I(k)\right\} + \\ &\quad \frac{RT}{T+RC}I(k+1) \\ &= \ldots \end{aligned} \tag{f9}$$

According to the formula (f9), since previous values of V (underlined portion in the formula (f9)) are required to calculate present values of V, that is, V is nested, recursion is necessary. Therefore, as a value of k increases, the formula (f9) is more complicated. Hence, it will be difficult to calculate the partial derivative using the formulas, that is, it will be difficult to substitute the formula (f9) in y(k) of a formula (f10), which is surrounded by a broken-line frame. Also, as the number of samplings increases, larger RAM capacity will be required to store the data.

[Eq. 7]

$$\nabla(k) = \frac{\partial J}{\partial W(k)} = \frac{\partial \frac{\sum \{d(k) - y(k)\}^2}{N}}{\partial W(k)} \tag{f10}$$

In the present embodiment, an infinitesimal change dW in the parameter is fixed (constant) and the slope is calculated numerically. Specifically, a multiply-accumulation of errors (sum of squared errors) using a parameter W and a multiply-accumulation of errors (sum of squared errors) using a parameter W+dW are calculated simultaneously at every sampling point, the parameter W+dW being obtained by shifting the parameter W by the infinitesimal change dW, which is determined beforehand. ∇ is obtained by subtracting a quotient of the sum of square errors using the parameter W divided by N from a quotient of the sum of square errors using the parameter W+dW divided by N, and dividing the subtracted difference by dW. As such, R and C do not remain as variables and a situation where ∇ is nested as described above can be avoided. Therefore, the calculation can be simplified. Specifically, as expressed by a formula (f11), dJ is obtained by determining dW beforehand, and the slope is obtained by dividing the dJ by the dW.

[Eq. 8]

$$\nabla(k) = \frac{\partial J}{\partial W(k)} \to \frac{J(k)|_{W=W+dW} - J(k)|_{W=W}}{dW(k)} \quad (f11)$$

$$= \frac{E[e^2(k)|_{W=W+dW}] - E[e^2(k)|_{W=W}]}{dW(k)}$$

$$= \frac{\dfrac{\sum_{i=1}^{k}\{d(i)-y(i)|_{W=W+dW}\}^2}{N} - \dfrac{\sum_{i=1}^{k}\{d(i)-y(i)|_{W=W}\}^2}{N}}{dW(k)}$$

Accordingly, since the R and the C need not to be remained as variables and the calculation can be made in a state where specific values are substituted, the situation where ∇ is nested as described above can be avoided.

Furthermore, to decrease the RAM capacity for storing the data, calculations expressed by a formula (f12), a formula (f13), a formula (f14) and a formula (f15) are made at every sampling point. Specifically, in the case where the calculation of the formula (f11) is made at once, the RAM needs to store all data that are required in the calculation. Conversely, in the case where the calculations of the formulas (f12), (f13), (f14) and (f15) are made at every sampling point, the RAM needs not to store all data and the RAM capacity can be decreased compared to the case where the calculation is made at once.

[Eq. 9]

$$e(k)|_{W=W+dW} = d(k) - y(k)|_{W=W+dW} \quad (f12)$$

$$e(k)|_{W=W} = d(k) - y(k)|_{W=W} \quad (f13)$$

[Eq. 10]

$$\sum_{i=1}^{k} e^2(i)|_{W=W+dW} = \sum_{i=1}^{k-1} e^2(i)|_{W=W+dW} + e^2(k)|_{W=W+dW} \quad (f14)$$

$$\sum_{i=1}^{k} e^2(i)|_{W=W} = \sum_{i=1}^{k-1} e^2(i)|_{W=W} + e^2(k)|_{W=W} \quad (f15)$$

Figure 4:
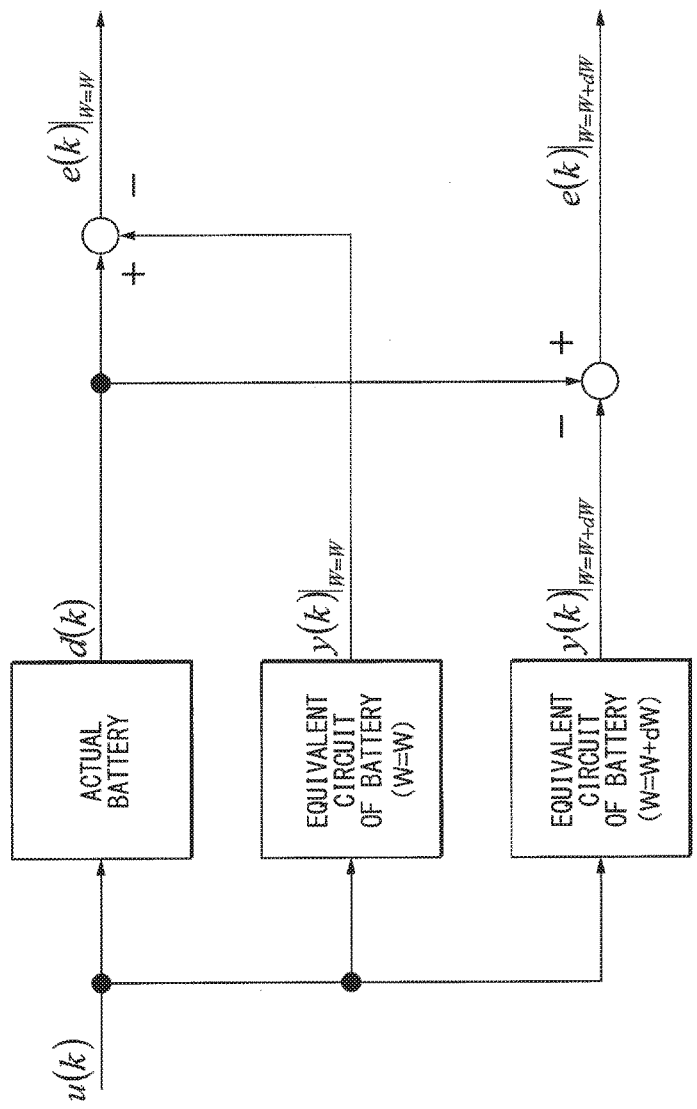
FIG. 4 is a block diagram to calculate an estimation error.

FIG. 4 is a block diagram illustrating a calculation to obtain the error e as expressed by the formula (f12) and the formula (f13). The formula (f12) is a formula to calculate an after-change estimation error. The after-change estimation error is obtained by a comparison between an actual output value d(k) after the infinitesimal change in the parameter W and an equivalent output value y(k) after the infinitesimal change in the parameter W. The formula (f13) is a formula to calculate a before-change estimation error. The before-change estimation error is obtained by a comparison between an actual output value d(k) before the infinitesimal change in the parameter W and an equivalent output value y(k) before the infinitesimal change in the parameter W.

Figure 5:
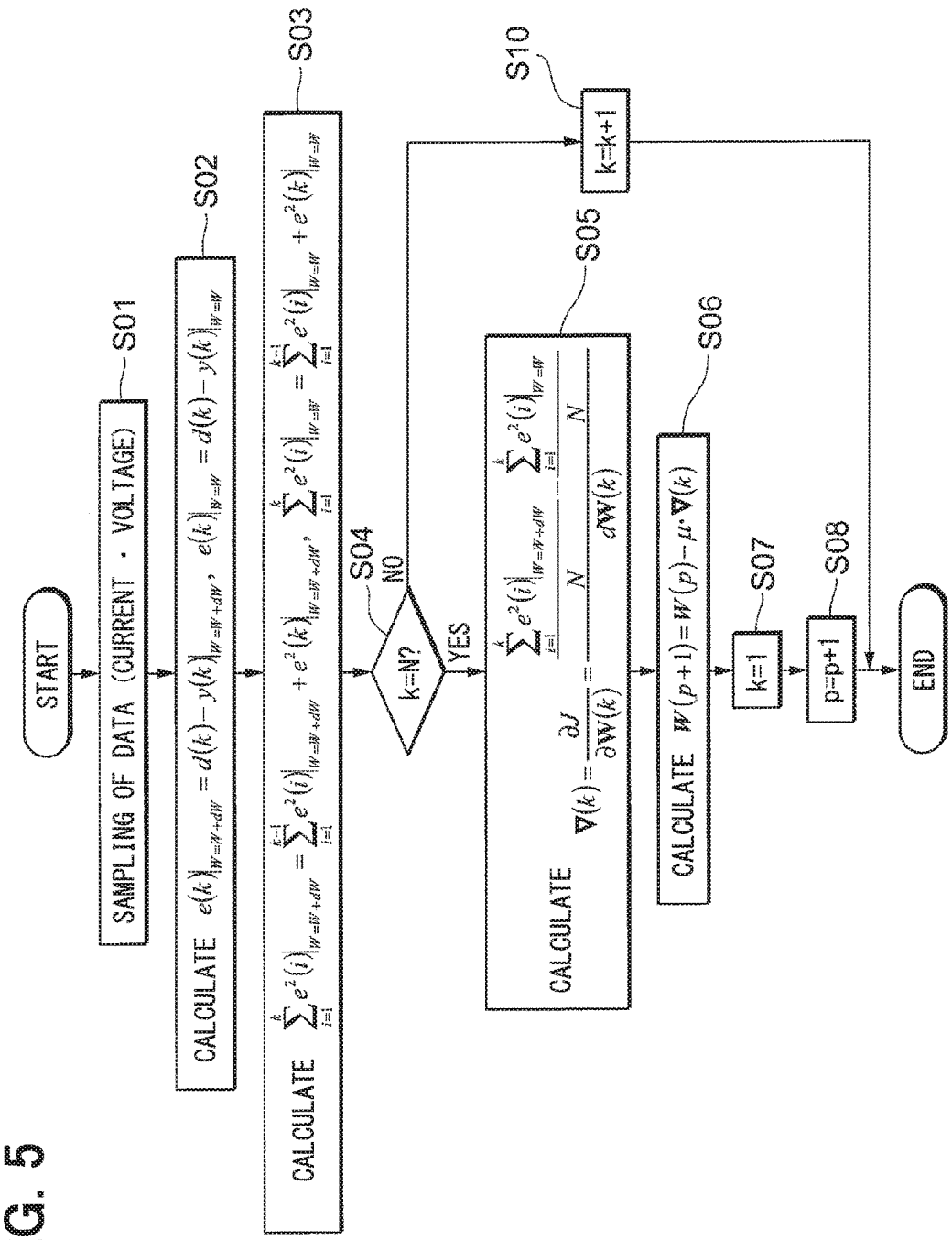
FIG. 5 is a flowchart in a case where the equivalent circuit model shown in FIG. 2 is a primary circuit.

Next, a method for identifying the parameters will be described with reference to FIG. 5, which is a flowchart in a case where the equivalent circuit model is a primary circuit (n=1). In the flowchart shown in FIG. 5, default values of k and p are 1. The infinitesimal change dW is determined before the processing of the flowchart shown in FIG. 5 is started At S01, data are sampled based on the output values of the current value measuring portion 20 and the voltage value measuring portion 22. At S02, a difference between the actual output value and the equivalent output value is calculated using the above-described formulas (f12) and (f13).

At S03, the sum of squared errors is calculated using the calculated result of S02 and the formulas (f14) and (f15). At S04, it is determined whether the subjective sampling point accords with an identifying point, that is, k=N. When the subjective sampling point accords with the identifying point (k=N), the processing proceeds to S05. When the subjective sampling point does not accord with the identifying point, the processing proceeds to S10. At S10, k is set to k+1 and the processing is finished.

At S05, by using the formula), the sum of squared errors is divided by N to obtain e and then ∇ is obtained.

At S06, W(p+1)=W(p)−μ·∇(k) is calculated and the parameters are identified.

At S07, k is set to 1. At S08, p is set to p+1 and the processing is finished.

Figure 6:
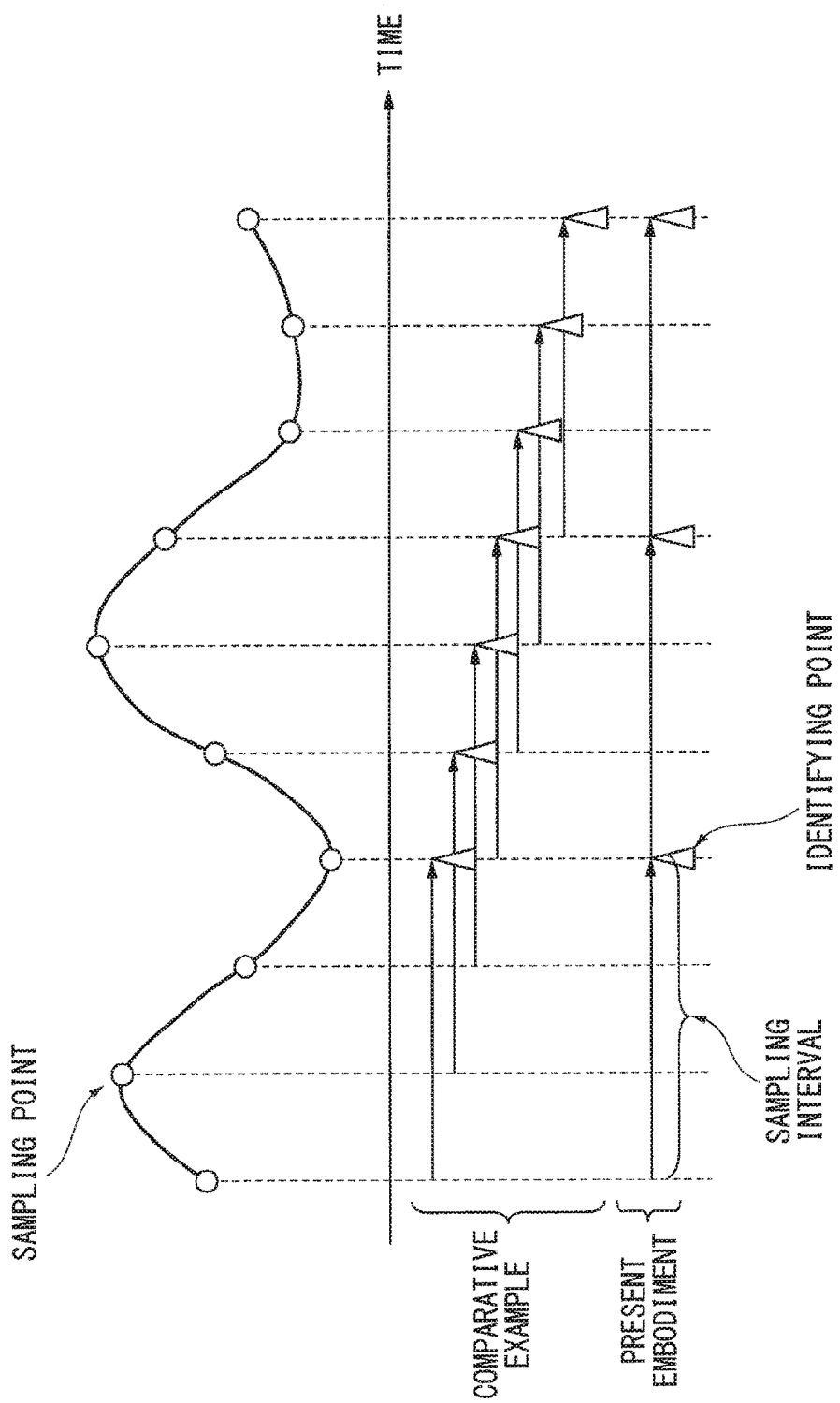
FIG. 6 is a diagram illustrating effects of the present embodiment.

Effects of reducing the RAM capacity will be described with reference to FIG. 6. FIG. 6 illustrates a sampling condition of the present embodiment and a sampling condition of a comparative example. Each arrow represents a sampling interval. FIG. 6 illustrates an example in which the sampling number N is 3. When N pieces of the data are sampled and calculated at once, all of the N pieces of the data need to be stored. On the other hand, in the present embodiment, since the sums of the squared errors are calculated one after another, all of the N pieces of the data need not to be stored. Also, it is advantageous that the sums of the squared errors are calculated one after another and a calculation amount at one-time can be reduced. That is, the present embodiment can achieve an effect that the calculation can be simplified in addition to an effect that the RAM capacity can be reduced.

However, since the N pieces of the data are not calculated at once and the past data are not stored and are discarded in the present embodiment, the identifying of the parameters cannot be processed in pipeline as described in the comparative example of FIG. 6. That is, the parameters cannot be identified at every sampling point. However, since the rate of the parameter changing is low in the diffusion resistance of the present embodiment, the calculating method described in FIG. 6 does not have any negative effect.

The embodiment described above is not limited to the hybrid vehicle and can be employed to a control unit of a secondary battery that is equipped to a vehicle driven by at least a motor, such as an electric vehicle. The present disclosure is not limited to the above embodiment. That is, it will be apparent for those skilled in the art from this disclosure to make various changes and modifications in the present disclosure. For example, each element and an arrangement or a condition thereof are not limited to the above embodiment and can be suitably modified. Furthermore, each element of the above embodiment can be suitably combined in the present disclosure.

What is claimed is:

1. A secondary battery control unit for controlling a secondary battery that is equipped to a vehicle driven by at least a motor, the secondary battery control unit comprising:
    an equivalent circuit expressing the secondary battery; and
    a calculating portion
        identifying a parameter of the equivalent circuit based on an estimation error that is obtained by a comparison between an actual output value of the secondary battery and an equivalent output value of the equivalent circuit,
        numerically calculating, based on a predetermined amount of an infinitesimal change in the parameter and an evaluation function that is obtained using a result of the comparison, a slope of the evaluation function, and
        renewing the parameter based on the slope.

2. The secondary battery control unit according to claim 1, wherein
    the equivalent circuit includes a direct current resistance, a reaction resistance having a nonlinear characteristic derived from Butler-Volmer equation, and a diffusion resistance having a plurality of parallel circuits each including a resistance and a capacitance, the plurality of parallel circuits being connected in series, and
    the parameter of the equivalent circuit includes a parameter of the diffusion resistance.

3. The secondary battery control unit according to claim 1, wherein
    at every sampling point, the calculating portion
        calculates a before-change estimation error and an after-change estimation error, the before-change estimation error being obtained by a comparison between an actual output value and an equivalent output value before an infinitesimal change in the parameter, the after-change estimation error being obtained by a comparison between an actual output value and an equivalent output value after the infinitesimal change in the parameter,
        calculates a before-change sum of squared errors before the infinitesimal change in the parameter using the before-change estimation error, and
        calculates an after-change sum of squared errors after the infinitesimal change in the parameter using the after-change estimation error.

4. The secondary battery control unit according to claim 3, wherein
    at an identifying point of every N times of the sampling points, the N being an integer equal to or larger than 2, the calculating portion
        determines a renewing amount of the parameter by subtracting a quotient of the before-change sum of square errors divided by the N from a quotient of the after-change sum of square errors divided by the N and dividing a subtracted difference by the predetermined amount of the infinitesimal change in the parameter, and
        renews the parameter.

* * * * *